(12) United States Patent
Chan et al.

(10) Patent No.: US 7,872,267 B2
(45) Date of Patent: Jan. 18, 2011

(54) LIGHT EMITTING DIODE AND MANUFACTURING METHOD THEREOF

(75) Inventors: Shih Hsiung Chan, Hsinchu County (TW); Chih Chiang Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 12/331,840

(22) Filed: Dec. 10, 2008

(65) Prior Publication Data

US 2009/0152577 A1 Jun. 18, 2009

(30) Foreign Application Priority Data

Dec. 12, 2007 (TW) ................ 96147358 A

(51) Int. Cl.
*H01L 27/15* (2006.01)
(52) U.S. Cl. .............. 257/79; 257/98; 257/99; 257/466; 257/E33.001
(58) Field of Classification Search ............ 257/79, 257/94, 98, 99, 466
See application file for complete search history.

(56) References Cited

U.S. PATENT DOCUMENTS

| | | | | |
|---|---|---|---|---|
| 2001/0033135 A1* | 10/2001 | Duggal et al. | ............... | 313/506 |
| 2006/0163606 A1* | 7/2006 | Wierer et al. | ............... | 257/103 |
| 2006/0234408 A1* | 10/2006 | Lee et al. | ............... | 438/22 |
| 2007/0284604 A1* | 12/2007 | Slater et al. | ............... | 257/98 |
| 2010/0117107 A1* | 5/2010 | Yuan et al. | ............... | 257/98 |

FOREIGN PATENT DOCUMENTS

CN  1744335 A  3/2006

OTHER PUBLICATIONS

Office Action dated Aug. 4, 2010 for 200710302032.7, which is a Chinese counterpart application, that cites CN1744335A.

* cited by examiner

*Primary Examiner*—Wai-Sing Louie
(74) *Attorney, Agent, or Firm*—Raymond J. Chew

(57) ABSTRACT

A light emitting diode comprises a substrate having a first surface and a second surface, a light emitting epitaxy structure placed on the first surface of the substrate, and a compound reflection layer placed on the second surface of the substrate. The second surface of the substrate further has a protection structure.

8 Claims, 5 Drawing Sheets

LIGHT EMITTING DIODE AND MANUFACTURING METHOD THEREOF

BACKGROUND OF THE INVENTION

1. Field of the Invention

The present invention relates to a structure for light emitting diode (LED) dies, and more particularly to an LED with a protection structure and a method of fabricating the same.

2. Description of the Related Art

LEDs (light emitting diode) have many advantages such as easily designed drive circuit, DC power use, low power consumption, and ease of application in mobile devices. Due to their compact size, they can also be integrated into devices of medium or small size, or into devices that need to be miniaturized. In addition, with increased RoHS (restrictions on hazardous substances) directive adopted in the European Union, LEDs have further environmental advantages. Furthermore, the products of the LEDs adopting the semiconductor process are firm, solid and anti-shock. Moreover, lights of different wavelengths within the visible light range can be emitted by the LEDs. LEDs are applied to a wide range of uses from indicator lights to other applications such as illuminations and backlight sources.

With conventional light sources (such as incandescent bulbs), much of the consumed energy is wasted in producing the infrared light that generates heat but cannot be seen by human beings. In addition, the working life of the light source based on cold cathode fluorescent lamps is shorter, and a stabilizer is needed for driving the lamps. In such lamps, an electric field between electrodes needs to stimulate mercury vapor for emitting light. Therefore, it cannot satisfy environmental requirements. In contrast, LEDs do not produce heat. For energy saving purpose, LED light sources with long working life are considered a more "green" energy source. There is a huge market demand for high-brightness LEDs.

In order to increase the brightness of the LED, there are two ways. One is to increase the current density passing through the LED, while the other is to use an LED die with large area (ex. 40×40 $mil^2$) to enhance the brightness.

In addition, another method to increase brightness is to reuse the light that is not directed externally. As shown in FIG. 1, the epitaxy structure layer 12 of an LED is formed on the epitaxial substrate 10. A so-called compound reflection metal layer including metallic aluminum layer 20, metallic titanium layer 22, metallic silver layer 24, and metallic tin layer 26 is formed under the epitaxial substrate 10. Generally, the brightness of LEDs can be enhanced by from 30 to 50% with the addition of a compound reflection metal layer.

After forming, the LED needs to be packaged for further application. At present, during the packaging, a die is mounted on a substrate by a silver-filled epoxy resin. This silver-filled epoxy resin with the capabilities of electric conduction and heat conduction is specially used for the die structure of an LED with opposite electrodes. After curing, an LED is mounted on a package substrate by the epoxy resin.

Another method for mounting an LED on a package substrate is a eutectic joint method. As shown in FIG. 2, the lowest layer, the metallic tin layer 26, of an LED can be adhered on the solder layer 30 of a package substrate to form a metal eutectic. The advantages of this metal eutectic method include a tight joint, high pull-push strength, and better heat dissipation.

However, during the soldering of the eutectic solder joint and the extruding process, the solder will climb up along the edges of a die and enter the reflection metal layer. As shown in FIG. 3, the climbing solder 40 may enter the interface between the epitaxial substrate 10 and metallic aluminum layer 20, the interface between metallic aluminum layer 20 and metallic titanium layer 22, the interface between metallic titanium layer 22 and metallic silver layer 24, or the interface between the metallic silver layer 24 and metallic tin layer 26. The solder 40 entering the interfaces between the layers will decrease the efficiency of the reflection and working life of the LCD.

From the above, the die structure of an LED that can prevent the solder from invading the interfaces between layers is needed for the market to overcome the shortcomings of the LEDs of prior arts.

SUMMARY OF THE INVENTION

An aspect of the present invention is to increase the quality and the yield rate of an LED. A protection structure is formed on the surface opposite to the epitaxy structure of the substrate of the LED. This protection structure can prevent solder from entering the interfaces between the compound metal reflection layers during the eutectic joint process.

The present invention discloses an LED, comprising a substrate having a first surface and a second surface, a light emitting epitaxy structure placed on the first surface of the substrate, and a compound reflection layer placed on the second surface of the substrate. The second surface of the substrate further has a protection structure.

A fabricating method of the above LED comprises the steps of: forming a light emitting epitaxy structure on the first surface of the substrate, forming a protection structure on the second surface of the substrate, and forming a compound reflection layer on the second surface of the substrate. The above substrate for epitaxy can be a sapphire substrate, a silicon carbide substrate, a GaAs substrate, a silicon substrate, an InP substrate, a GaP substrate, or a ZnO substrate.

Another fabricating method of the above LED comprises the steps of: providing a temporary substrate; forming a light emitting epitaxy structure on the temporary substrate; forming a substrate on the light emitting epitaxy structure; removing the temporary substrate; forming a protection structure on the substrate; and forming a compound reflection layer on the substrate.

The above protection structure having at least one trench or a plurality of trench patterns is overlaid on the substrate. The shape of the trench patterns is similar or dissimilar to the shape of the light emitting diode.

The above compound reflection layer can be Ni/Au/Al/Ti/Au, ITO/Al/Ti/Au, ITO/Al/Ti/Ag, ITO/SiO$_2$/Al/SiO$_2$, SiO$_2$/Al/SiO$_2$/Ag, or Al/Ti/Ag. The compound reflection layer further comprises a metallic tin layer for mounting the light emitting diode on the substrate by a eutectic joint method.

BRIEF DESCRIPTION OF THE DRAWINGS

The invention will be described according to the appended drawings in which.

PREFERRED EMBODIMENT OF THE PRESENT INVENTION

The detailed description of exemplary embodiments herein makes reference to the accompanying drawings that show the exemplary embodiment by way of illustration. While these exemplary embodiments are described in sufficient detail to enable those skilled in the art to practice the invention, it should be understood that other embodiments may be realized and that logical and mechanical changes may be made without departing from the spirit and scope of the invention. The following detailed description is, therefore, not to be taken in a limiting sense, and the scope of the present invention is defined only by the appended claims.

An aspect of the present invention is to form a protection structure on the substrate of an LED to prevent the solder from entering the interfaces between the compound metal reflection layers during the eutectic joint process. The protection structure can be formed during the die cutting process after the growth of epitaxial layers. It also can be formed before the growth of epitaxial layers. During the die cutting process, the protection structure and the compound metal reflection layers can be formed before forming the electrodes of an LED. Or, they are formed before the die cutting of an epitaxy wafer and after the forming of the electrodes of the LEDs and protection structure.

The trench of the protection structure is to increase the distance for the solder to travel as it enters the interfaces between the compound metal reflection layers. The trench also changes the entering direction of the solder and then further increases the resistance for the solder to enter.

The shape of the pattern of the trench can be the shape of a die (a square), other shapes (e.g., a circle, an ellipse, a rhombus, or other random polygon), a regular shape, or a non-regular shape. There is no limitation for the depth of the trench as long as the purpose of increasing the difficulty of entering the interfaces between the compound metal reflection layers is achieved. There is no limitation for the width of the trench as long as the compound metal reflection layers can be formed in a conforming way. The number of trenches can be one, two, or three, or trenches can be formed on the entire back surface of a die. The etching method can be used for forming the trench. The selection of an etchant depends on the substrate utilized.

The substrate can be the epitaxial substrate or other substrates. A lift-off process, to remove the original epitaxial substrate, is performed after forming a second substrate on the original epitaxial substrate. For example, after forming a GaP substrate or a metal substrate on one side of an epitaxy structure, a GaAs substrate is then removed from the other side of the epitaxy structure; alternatively, after forming a metal substrate on one side of an epitaxy structure, a sapphire substrate is then removed from the other side of the epitaxy structure by LASER lift-off process.

Figure 1:
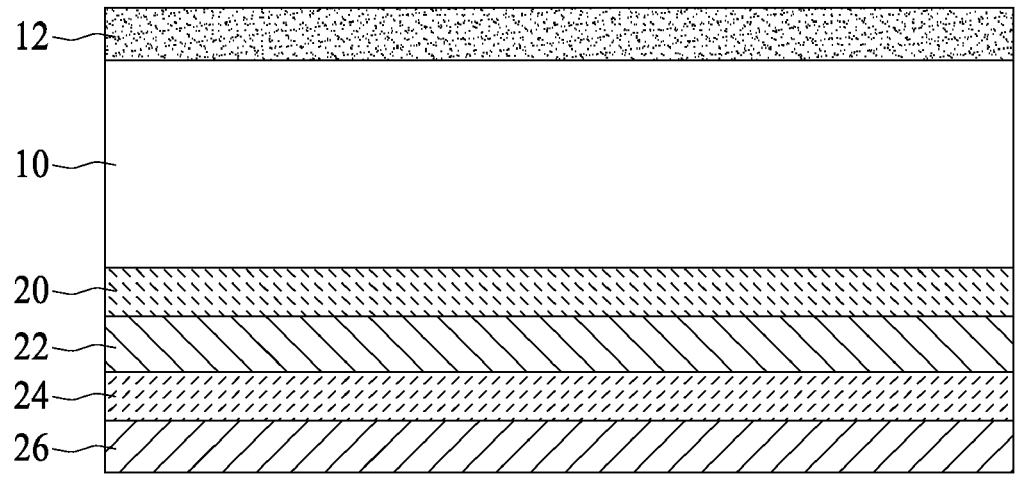
FIG. 1 is a cross-sectional diagram of a light emitting diode device that uses a conventional method to form a reflection metal layer.
Figure 2:
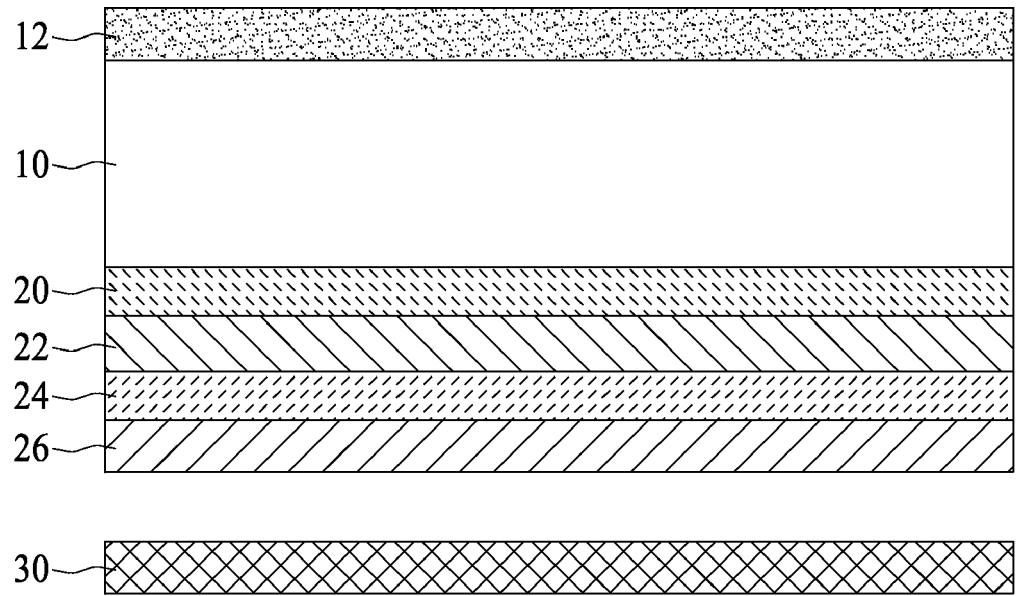
FIG. 2 is a diagram showing a light emitting diode using the eutectic joint process.
Figure 3:
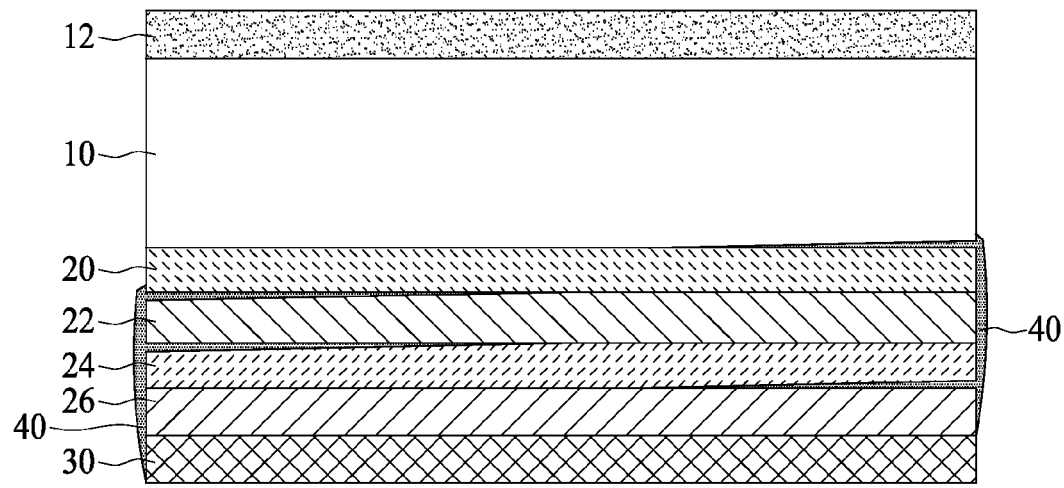
FIG. 3 shows the climbing solder problem occurring in the prior arts during the eutectic joint process.
Figure 4:
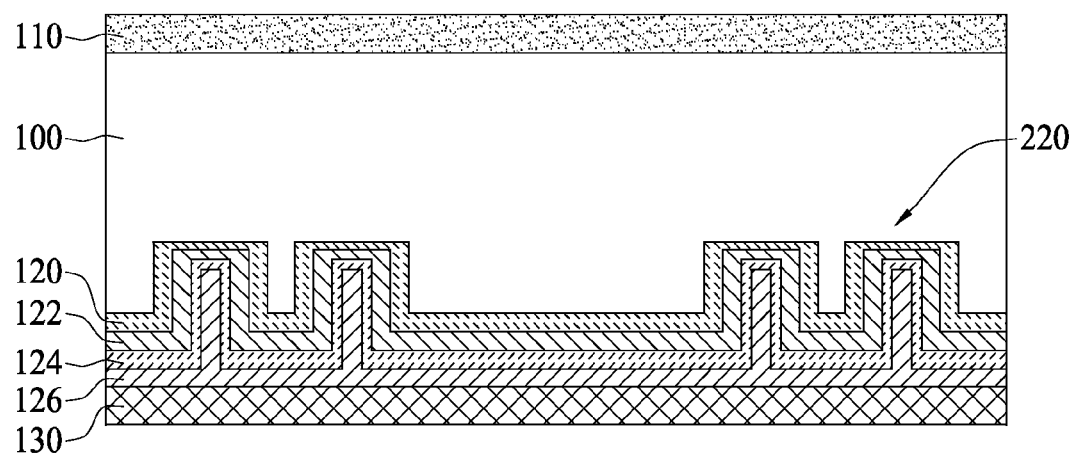
FIG. 4 is a cross-sectional diagram showing a light emitting diode having a protection structure in accordance with the embodiment of the present invention.

FIG. 4 is a cross-sectional diagram showing a light emitting diode in accordance with the embodiment of the present invention. The light emitting epitaxy structure 110 is formed on the first surface of the epitaxial substrate 100, wherein the light emitting epitaxy structure 110 comprises an N-type compound semiconductor layer and a P-type compound semiconductor layer. The epitaxial substrate can be a sapphire substrate, a silicon carbide substrate, a GaAs substrate, a silicon substrate, an InP substrate, a GaP substrate, or a ZnO substrate. The epitaxy structure 110 can be the III-V group compound semiconductor materials such as arsenides, phosphides, and nitrides. These materials comprise GaAs, GaP, $Al_xGa_yP$, $In_xGa_yP$, $Al_xGa_yIn_zP$, GaN, $Al_xGa_yN$, $In_xGa_yN$, and $Al_xGa_yIn_zN$. The epitaxy structure 110 also can be the II-VI group compound semiconductor materials. The epitaxy structure 110 is formed in the chemical vapor phase deposition chamber by epitaxy process such as organometal vapor phase epitaxy (OMVPE), and hydride vapor phase epitaxy (HVPE). An active layer is formed between an N-type compound semiconductor layer and a P-type compound semiconductor layer to increase the light emitting efficiency. The active layer, the N-type compound semiconductor layer, and the P-type compound semiconductor layer are combined to form a so-called double hetrostructure. Another type of active layer comprising multiple quantum well structure can further increase the light emitting efficiency.

After forming the epitaxy structure 110, at least one trench 220 is formed on the second surface of the substrate 100. "Second surface" generally refers to the back surface of an LED. The requirement for the depth of the trench 220 is to not affect the light emitting efficiency of the LED. The compound metal reflection layers comprise a metallic aluminum layer 120, a metallic titanium layer 122, and a metallic silver layer 124. These metallic layers are sequentially formed on the trenches of the back surface of the substrate 100 in a conforming manner. The last layer, a metallic tin layer 126, of the compound metal reflection layers is formed to fill the depressions of the trench 220. The metallic tin layer 126 is helpful for the die to adhere to the solder layer 130 of a packing substrate by a eutectic joint method.

Figure 5:
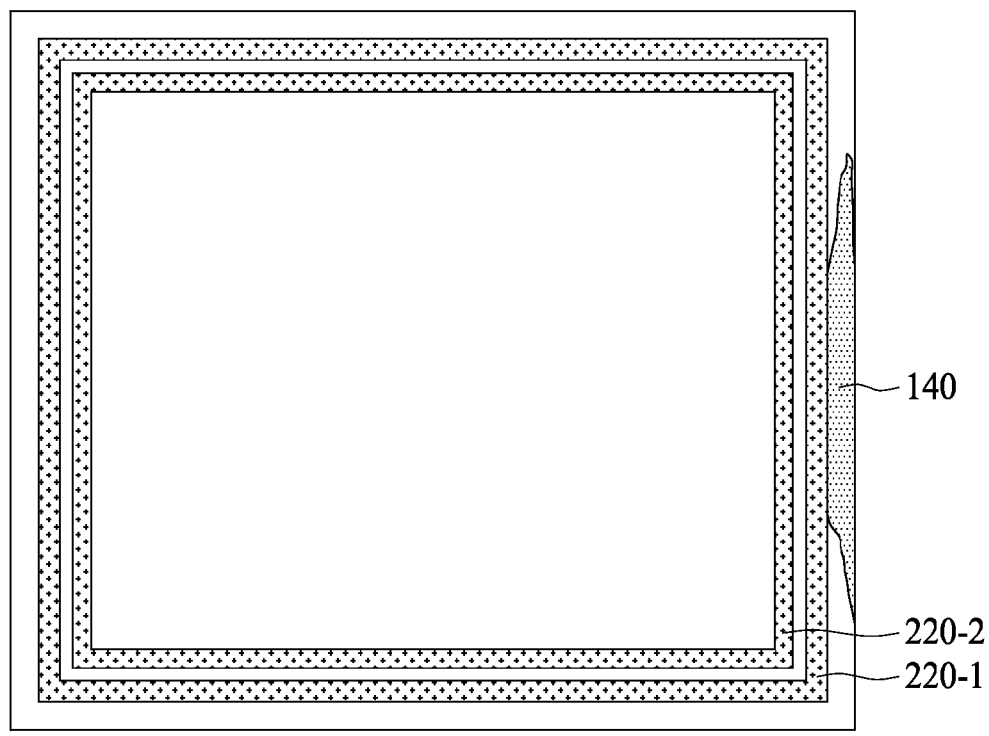
FIG. 5 shows the top view of the light emitting diode having a protection structure shown in FIG. 4 after the solder penetrating.

FIG. 5 shows the top view of the cross-sectional diagram shown in FIG. 4. Moreover, FIG. 5 is the top view of the first surface of the substrate 100 (assuming that the substrate 100 and the epitaxy structure 110 are transparent). In FIG. 5, the shapes of the trenches 220-1 and 220-2 are similar to the shape of the die of the LED. In FIG. 5, the trenches are illustrated with the hatched portions. The climbing solder 140 rises from the side of the LED. However, it is difficult for the solder 140 to further penetrate when the solder 140 meets the trench 220-1. Therefore, forming more trenches can limit the solder 140 to further penetrate.

Figure 6:
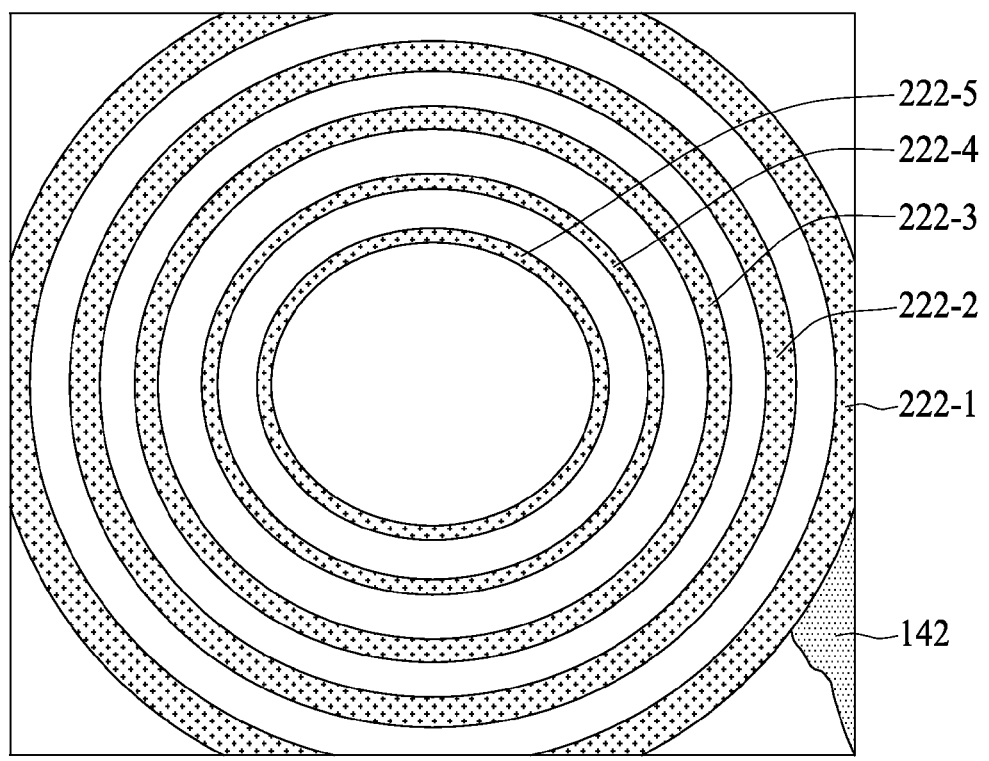
FIG. 6 shows another top view of the light emitting diode having a protection structure shown in FIG. 4 after the solder penetrating.

FIG. 6 shows another top view of the cross-sectional diagram shown in FIG. 4. In this exemplary embodiment, there are five trenches 221-1, 221-2, 221-3, 221-4, and 221-5. The shape of each trench is round. In FIG. 6, the widths of trenches are different. The variations of the widths can be regular or non-regular. The climbing solder 142 penetrates from the side of the LED. However, it is difficult for the solder 142 to further penetrate when the solder 142 meets the trench 222-1.

Even if the solder 142 can cross the trench 222-1, other trenches will stop the solder 142 from penetrating further.

The diagrams corresponding to the steps for forming the LED shown in FIG. 4 are illustrated in FIG. 7 to FIG. 11.

Figure 7:
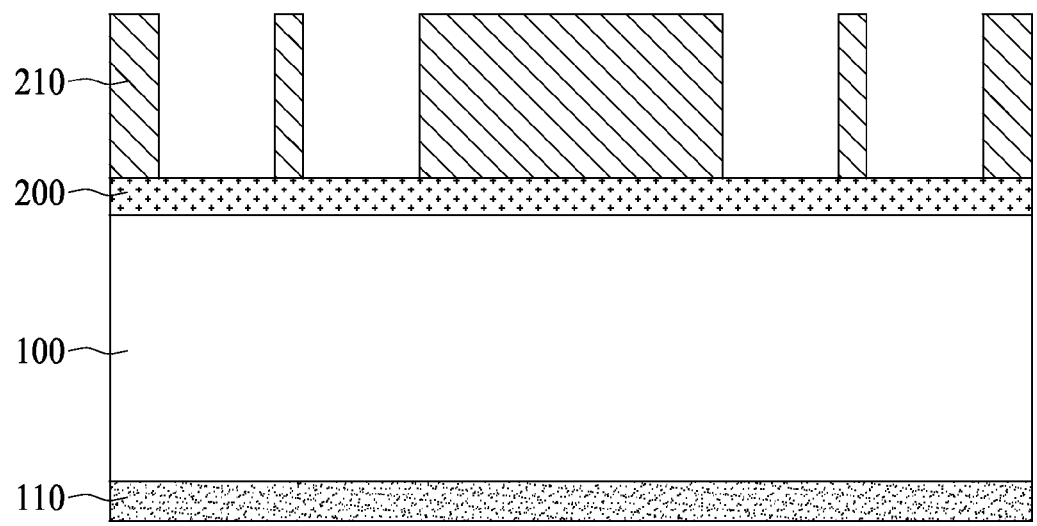
FIG. 7 shows the cross-sectional diagram corresponding to the steps for forming the LED having a protection structure in accordance with the method of the present invention, wherein the patterned photo-resist is formed.

As shown in FIG. 7, the epitaxy structure 110 of an LED is formed on the first surface of the epitaxial substrate 100. A hard mask layer 200 is formed on the second surface of the epitaxial substrate 100. In this exemplary embodiment, the material of the hard mask layer 200 is $SiO_2$. On the hard mask layer 200, a patterned photo-resist layer 210 is formed. The formation method of $SiO_2$ can be a physical vapor deposition, a chemical vapor deposition, or a spin on coating. For example, chemical vapor deposition can be atmospheric pressure chemical vapor deposition, low-pressure chemical vapor deposition, plasma enhanced chemical vapor deposition, or high-density plasma enhanced chemical vapor deposition. The material of the spin on coating can be tetraethyl silicate. The hard mask layer 200 can be formed with other materials such as $Si_3N_4$, SiON, or other materials with etching selectivity to the epitaxial substrate 100, wherein higher etching selectivity is preferred.

A positive type photo-resist or a negative type photo-resist is selected for the photo-resist layer 210. The spin coating method is used for forming the photo-resist 210 on the hard mask layer 200. After executing the procedures of a pre-bake, an exposure, a development, and a post bake, the patterned photo-resist layer 210 is formed.

In this exemplary embodiment, a sapphire substrate is used as the epitaxial substrate 100. Moreover, other materials also can be used for forming the epitaxial substrate 100.

Figure 8:
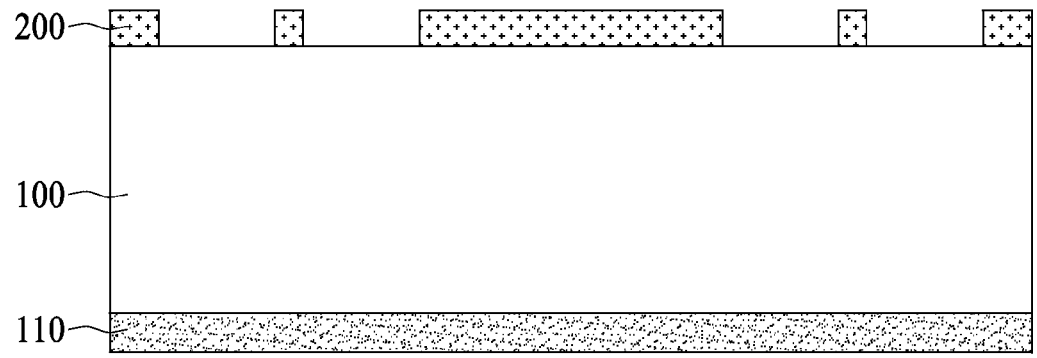
FIG. 8 shows the cross-sectional diagram corresponding to the steps for forming the LED having a protection structure in accordance with the method of the present invention, wherein the hard mask layer with the trench pattern is formed after an etching process.

Subsequently, as shown in FIG. 8, the photo-resist layer 210 is applied for etching the hard mask layer 200. The etching method can be dry etching or wet etching. During the wet etching process, the etchant can be an HF for etching the $SiO_2$. During the dry etching process, a reactive ion etching (RIE) technique, a magnetic enhanced reactive ion etching (MERIE) technique, an electron cyclotron resonance (ECR) technique, a helicon wave excited plasma (HWP) technique, or an inductively coupled plasma (ICP) technique using perfluorocarbon plasma can be applied.

Figure 9:
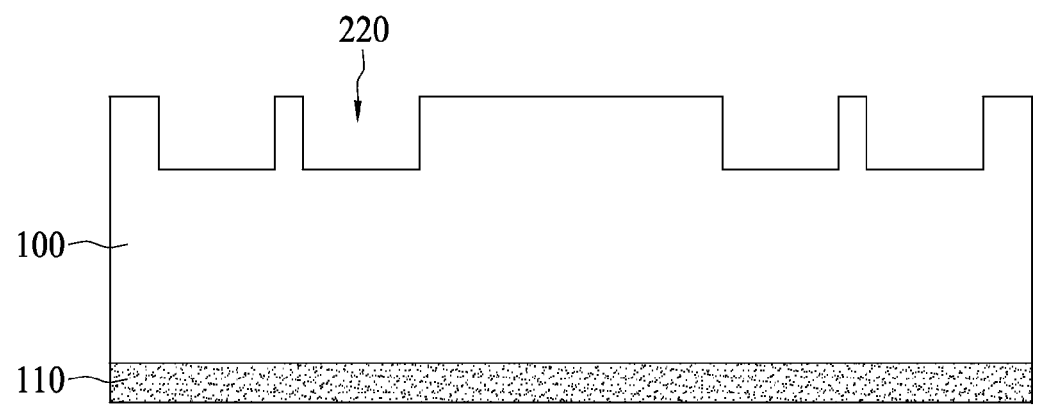
FIG. 9 shows the cross-sectional diagram corresponding to the steps for forming the LED having a protection structure in accordance with the method of the present invention, wherein the substrate with the trench pattern is formed after an etching process.

In FIG. 9, using a hard mask layer 200 as a mask, epitaxial substrate 100 is etched to form the trenches 220, wherein the etching method can be dry etching or wet etching. In this exemplary embodiment, a sapphire substrate is used as the epitaxial substrate 100. Therefore, the phosphoric acid and the sulfuric acid are selected as the etchant for the dry etching. For the wet etching, the vapor plasma using boron trichloride as a basis is used. The RIE technique, the MERIE technique, the ECR technique, the HWP technique, or the ICP technique can be applied for the dry etching process. The difference between the dry etching and wet etching processes is the shape of the etching required. The dry etching is better for this exemplary embodiment. With this etching process, because of nearly vertical corners, it is more difficult for the climbing solder to penetrate the interfaces of the compound metal reflection layers.

Figure 10:
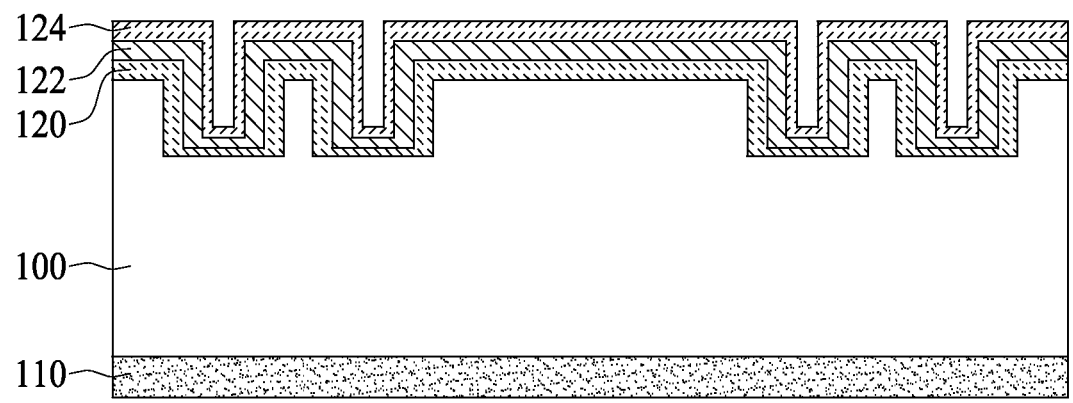
FIG. 10 shows the cross-sectional diagram corresponding to the steps for forming the LED having a protection structure in accordance with the method of the present invention, wherein the compound metal reflection layers are sequentially formed on the substrate with the trench pattern.
Figure 11:
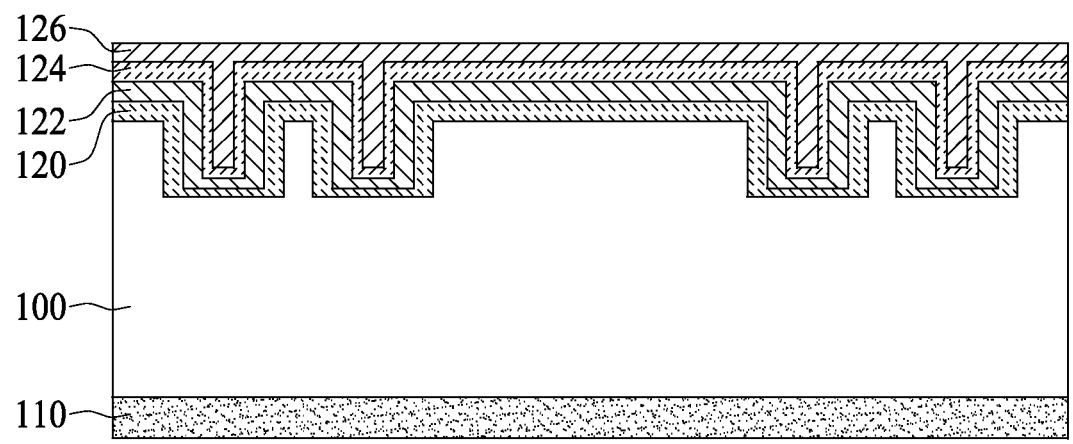
FIG. 11 shows the cross-sectional diagram corresponding to the steps for forming the LED having a protection structure in accordance with the method of the present invention, wherein the metallic tin layer is formed on the compound metal reflection layers with an eutectic joint method.

In FIG. 10, the compound metal reflection layers comprise a metallic aluminum layer 120, a metallic titanium layer 122, and a metallic silver layer 124. These metallic layers are sequentially formed on the trenches. These three layers are conformal layers. The formation method for these layers can be the chemical vapor phase deposition or the physical vapor phase deposition such as an evaporation method, a sputter method, a molecular beam epitaxy method, an electroplating method, or a chemical plating method.

However, conformal layers can only be formed on the first metallic aluminum layer 120, and the following metallic titanium layer 122 or the metallic silver layer 124 fills up the trenches.

In addition to the compound metal reflection layers used in this exemplary embodiment, other compound metal reflection layers can be used, such as Ni/Au/Al/Ti/Au, ITO/Al/Ti/Au, ITO/Al/Ti/Ag, ITO/$SiO_2$/Al/$SiO_2$, or $SiO_2$/Al/$SiO_2$/Ag.

Subsequently, the metallic tin layer 126 is formed to fill the depressions of the trenches. The formation method for the metallic tin layer 126 can be the chemical vapor phase deposition or the physical vapor phase deposition such as a sputter method, a molecular beam epitaxy method, an electroplating method, or a chemical plating method or an evaporation method wherein the heat source for evaporation can be generated with electron beam, radio frequency or heat plate.

For the LEDs that are formed using the lift-off process and in which the substrate 100 is not an epitaxy structure, the invention can also be applied. However, if the substrate 100 is metal, there are different ways to form the trench. One simple way is to form a p-type compound semiconductor layer with a sufficient thickness and then form the trenches on the p-type compound semiconductor layer. Afterward, the metallic substrate with the trench pattern is a conformal layer. Another way is to directly form the trenches on the metallic layer.

The above-described embodiments of the present invention are intended to be illustrative only. Numerous alternative embodiments may be devised by persons skilled in the art without departing from the scope of the following claims.

What is claimed is:

1. A light emitting diode, comprising:
    a substrate having a first surface and a second surface, wherein the second surface has a protection structure and the protection structure has a plurality of trenches;
    a light emitting epitaxy structure placed on the first surface of the substrate; and
    a plurality of compound reflection layers placed in the plurality of trenches.

2. The light emitting diode of claim 1, wherein the material of the substrate is a sapphire substrate, a silicon carbide substrate, a GaAs substrate, a silicon substrate, an InP substrate, a GaP substrate, or a ZnO substrate.

3. The light emitting diode of claim 1, wherein the material of the compound reflection layer is Ni/Au/Al/Ti/Au, ITO/Al/Ti/Au, ITO/Al/Ti/Ag, ITO/Si $O_2$/Al/$SiO_2$, $SiO_2$/Al/$SiO_2$/Ag, or Al/Ti/Ag.

4. The light emitting diode of claim 1, wherein the compound reflection layer further comprises a metallic tin layer for mounting the light emitting diode on a package substrate by a eutectic joint method.

5. A light emitting diode, comprising:
    a light emitting epitaxial structure having a first surface and a second surface, wherein the first surface has a plurality of trenches; and
    a plurality of compound metal reflection layers placed in the plurality of trenches, wherein the compound metal reflection layer supports the light emitting diode to mount on a package substrate by a eutectic joint method.

6. The light emitting diode of claim 5, wherein the material of the compound reflection layer is Ni/Au/Al/Ti/Au, ITO/Al/Ti/Au, ITO/Al/Ti/Ag, ITO/$SiO_2$/Al/Si/$O_2$, $SiO_2$/Al/$SiO_2$/Ag, or Al/Ti/Ag.

7. The light emitting diode of claim 5, wherein the compound reflection layer further comprises a metallic tin layer for mounting the light emitting diode on a package substrate by a eutectic joint method.

8. The light emitting diode of claim 5, further comprising a metal substrate on the compound metal reflection layer.

* * * * *